(12) United States Patent
Roh

(10) Patent No.: US 9,231,230 B2
(45) Date of Patent: Jan. 5, 2016

(54) ORGANIC LIGHT EMITTING DIODE DISPLAY AND METHOD OF MANUFACTURING THE SAME

(71) Applicant: Moon-Seok Roh, Gyeonggi-Do (KR)

(72) Inventor: Moon-Seok Roh, Gyeonggi-Do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 148 days.

(21) Appl. No.: 13/972,104

(22) Filed: Aug. 21, 2013

(65) Prior Publication Data

US 2014/0054569 A1 Feb. 27, 2014

(30) Foreign Application Priority Data

Aug. 22, 2012 (KR) ........................ 10-2012-0091825

(51) Int. Cl.
*H01L 51/50* (2006.01)
*H01L 33/52* (2010.01)
*H01L 51/52* (2006.01)

(52) U.S. Cl.
CPC .................................. *H01L 51/5246* (2013.01)

(58) Field of Classification Search
CPC .................................................... H01L 51/5246
USPC .................................................... 257/99, 701
See application file for complete search history.

(56) References Cited

U.S. PATENT DOCUMENTS 6,605,826 B2 * 8/2003 Yamazaki et al. ............... 257/72
6,655,788 B1 * 12/2003 Freeman .......................... 347/58
6,717,052 B2 * 4/2004 Wang et al. .................... 174/381
6,791,256 B2 * 9/2004 Nishizawa et al. ............ 313/495
6,896,572 B2 * 5/2005 Park et al. ......................... 445/25
6,965,195 B2 * 11/2005 Yamazaki et al. ............. 313/498
7,193,218 B2 * 3/2007 Nagano ..................... 250/370.11
7,255,823 B1 * 8/2007 Guenther et al. .............. 264/263
7,446,472 B2 * 11/2008 Matsukaze ..................... 313/506
7,498,186 B2 * 3/2009 Lee ................................. 438/28
7,514,280 B2 * 4/2009 Lee ................................. 438/28
7,595,854 B2 * 9/2009 Sung et al. ..................... 349/139
7,811,147 B2 * 10/2010 Kim et al. ........................ 445/25
7,825,594 B2 * 11/2010 Lee et al. ....................... 313/512
7,944,143 B2 * 5/2011 Choi et al. ..................... 313/512
7,990,059 B2 * 8/2011 Matsudate et al. ............ 313/512
8,038,495 B2 * 10/2011 Lee et al. ......................... 445/23
8,154,198 B2 * 4/2012 Lee et al. ....................... 313/504
8,188,509 B2 * 5/2012 Lee ................................. 257/100
8,315,070 B2 * 11/2012 Yee et al. ....................... 361/829

(Continued)

FOREIGN PATENT DOCUMENTS

KR 10-2008-0088696 A 10/2008
KR 10-2009-0086738 A 8/2009

(Continued)

*Primary Examiner* — Earl Taylor
(74) *Attorney, Agent, or Firm* — Lee & Morse, P.C.

(57) ABSTRACT

An organic light emitting diode display includes a display substrate including a display region having an organic light emitting diode; an encapsulation substrate facing the display substrate and covering the display region; a first sealing material between the display substrate and the encapsulation substrate, the first sealing material sealing the display region; a second sealing material in contact with an external exposed surface of the first sealing material and sealing the first sealing material; and a molding portion surrounding a lateral surface and an external corner of each of the display substrate and the encapsulation substrate and surrounding an external exposed surface of the second sealing material.

16 Claims, 17 Drawing Sheets

(56) References Cited

U.S. PATENT DOCUMENTS

| | | | |
|---|---|---|---|
| 8,319,355 B2* | 11/2012 | Shih | 257/789 |
| 8,319,425 B2* | 11/2012 | Kwon | 313/512 |
| 8,415,880 B2* | 4/2013 | Choi et al. | 313/512 |
| 8,466,616 B2* | 6/2013 | Choi | 313/512 |
| 8,569,749 B2* | 10/2013 | Kim | 257/40 |
| 8,647,899 B2* | 2/2014 | Choi et al. | 438/27 |
| 8,710,492 B2* | 4/2014 | Niboshi et al. | 257/40 |
| 8,829,668 B2* | 9/2014 | Yamazaki et al. | 257/710 |
| 8,872,197 B2* | 10/2014 | Hong | 257/88 |
| 8,883,527 B2* | 11/2014 | Wu | 438/26 |
| 8,884,279 B2* | 11/2014 | Liu et al. | 257/40 |
| 8,970,022 B2* | 3/2015 | Choi et al. | 257/682 |
| 9,004,972 B2* | 4/2015 | Choi et al. | 445/25 |
| 9,006,970 B2* | 4/2015 | Song et al. | 313/512 |
| 2002/0125817 A1* | 9/2002 | Yamazaki et al. | 313/498 |
| 2003/0066311 A1* | 4/2003 | Li et al. | 65/43 |
| 2003/0155861 A1* | 8/2003 | Nishizawa et al. | 313/512 |
| 2003/0214612 A1* | 11/2003 | Freeman | 349/12 |
| 2003/0218422 A1* | 11/2003 | Park et al. | 313/512 |
| 2005/0140265 A1* | 6/2005 | Hirakata | 313/483 |
| 2005/0174048 A1* | 8/2005 | Matsukaze | 313/506 |
| 2007/0170324 A1* | 7/2007 | Lee et al. | 248/247 |
| 2007/0170423 A1* | 7/2007 | Choi et al. | 257/40 |
| 2007/0170839 A1* | 7/2007 | Choi et al. | 313/500 |
| 2007/0170845 A1* | 7/2007 | Choi et al. | 313/504 |
| 2007/0170849 A1* | 7/2007 | Park | 313/506 |
| 2007/0170860 A1* | 7/2007 | Choi et al. | 313/512 |
| 2007/0170861 A1* | 7/2007 | Lee et al. | 313/512 |
| 2007/0172971 A1* | 7/2007 | Boroson | 438/26 |
| 2007/0173167 A1* | 7/2007 | Choi | 445/25 |
| 2007/0252266 A1* | 11/2007 | Koo et al. | 257/701 |
| 2008/0143247 A1* | 6/2008 | Kim et al. | 313/504 |
| 2008/0203904 A1* | 8/2008 | Kim et al. | 313/504 |
| 2008/0238311 A1* | 10/2008 | Sung et al. | 313/512 |
| 2010/0117531 A1* | 5/2010 | Park et al. | 313/512 |
| 2010/0207506 A1* | 8/2010 | Kwon | 313/323 |
| 2010/0244057 A1* | 9/2010 | Ryu et al. | 257/88 |
| 2011/0248626 A1* | 10/2011 | Matsudate et al. | 313/504 |
| 2011/0278550 A1* | 11/2011 | Ha | 257/40 |
| 2012/0056530 A1* | 3/2012 | Yee | 313/504 |
| 2012/0230037 A1* | 9/2012 | Lee et al. | 362/296.04 |
| 2014/0054569 A1* | 2/2014 | Roh | 257/40 |

FOREIGN PATENT DOCUMENTS

| | | |
|---|---|---|
| KR | 10-2010-0054002 A | 5/2010 |
| KR | 10-2011-0125931 A | 11/2011 |

* cited by examiner

ORGANIC LIGHT EMITTING DIODE DISPLAY AND METHOD OF MANUFACTURING THE SAME

CROSS-REFERENCE TO RELATED APPLICATION

This application claims priority to and the benefit of Korean Patent Application No. 10-2012-0091825 filed in the Korean Intellectual Property Office on Aug. 22, 2012, the entire contents of which are incorporated herein by reference.

BACKGROUND

1. Field

Embodiments relate to an organic light emitting diode display and a method of manufacturing the same.

2. Description of the Related Art

An organic light emitting diode display is a self-luminance type display device including a hole injection electrode, an electron injection electrode, and an organic emission layer formed therebetween. The organic light emitting diode display emits light by recombining holes injected from an anode and electrons injected from a cathode in the organic emission layer and dissipating the holes and the electrons. Further, the organic light emitting diode display exhibits high quality characteristics such as low power consumption, high luminance, and high reaction speed. Accordingly, the organic light emitting diode display receives attention as a next generation display device of a portable electronic device.

The organic light emitting diode display includes an organic light emitting display panel including a display substrate on which a thin film transistor and an organic light emitting diode (OLED) are formed. The organic light emitting diode includes an anode, a cathode, and an organic emission layer. Holes and electrons injected from the anode and the cathode, respectively, form an exciton, and light is emitted while the exciton is transferred to a bottom state.

SUMMARY

Embodiments are directed to an organic light emitting diode display including a display substrate including a display region having an organic light emitting diode, an encapsulation substrate facing the display substrate and covering the display region, a first sealing material between the display substrate and the encapsulation substrate, the first sealing material sealing the display region, a second sealing material in contact with an external exposed surface of the first sealing material and sealing the first sealing material, and a molding portion surrounding a lateral surface and an external corner of each of the display substrate and the encapsulation substrate and surrounding an external exposed surface of the second sealing material.

The molding portion may be formed of a material having elastic force. The material having the elastic force may include any one selected from rubber, urethane, and silicon.

The molding portion may include an opening passing therethrough in a thickness direction in a region in contact with the external exposed surface of the second sealing material. The opening may include a plurality of openings disposed at predetermined intervals.

The first sealing material may be positioned on internal sides of the display substrate and the encapsulation substrate, spaced apart from lateral surfaces of the display substrate and the encapsulation substrate. The second sealing material may be formed between the display substrate and the encapsulation substrate.

The external exposed surface of the second sealing material may form a continuous flat surface together with the lateral surface of the display substrate and the lateral surface of the encapsulation substrate.

The second sealing material may cover internal corners facing each other in the display substrate and the encapsulation substrate, the lateral surface of the display substrate, and the lateral surface of the encapsulation substrate. The molding portion may include a display substrate molding portion formed along an external corner of the display substrate to surround a portion of the external exposed surface of the second sealing material, an encapsulation substrate molding portion spaced from the display substrate molding portion and formed along an external corner of the encapsulation substrate to surround the portion of the external exposed surface of the second sealing material, and a connection portion connecting the display substrate molding portion and the encapsulation substrate molding portion. The connection portion may include a plurality of connection portions at predetermined intervals.

Embodiments are also directed to a method of manufacturing an organic light emitting diode display including preparing a display substrate including a display region having an organic light emitting diode, preparing an encapsulation substrate, sealing the display region by forming a first sealing material between the encapsulation substrate and the display substrate, forming a molding portion so as to surround a lateral surface and an external corner of each of the display substrate and the encapsulation substrate, and sealing the first sealing material by forming a second sealing material between the first sealing material and the molding portion.

The molding portion may include an opening formed therethrough in a thickness direction at a position corresponding to a position of the first sealing material. The sealing of the first sealing material may include injecting the second sealing material in a liquid phase through the opening. The opening may include a plurality of openings at predetermined intervals.

The molding portion further may include a guide portion connected to the opening, the guide portion including a path having an injection unit at an external side thereof through which the second sealing material is injected. The second sealing material may be injected through the guide portion into the opening. The injection unit of the guide portion may have a caliber that is smaller than a caliber of the opening.

The method may further include, after the second sealing material is injected along the path of the guide portion, removing the guide portion by cutting the guide portion.

The molding portion may be formed of a material having elastic force. The material having the elastic force may include any one selected from rubber, urethane, and silicon.

The molding portion may include a display substrate molding portion formed along an external corner of the display substrate to surround a portion of the external exposed surface of the second sealing material, an encapsulation substrate molding portion spaced from the display substrate molding portion and formed along an external corner of the encapsulation substrate to surround the portion of the external exposed surface of the second sealing material, and a plurality of connection portions connecting the display substrate molding portion and the encapsulation substrate molding portion and disposed to be disposed at predetermined intervals. The sealing of the first sealing material may include providing the second sealing material in a liquid phase to inject the second sealing material through a space formed between the connection portions spaced from each other.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
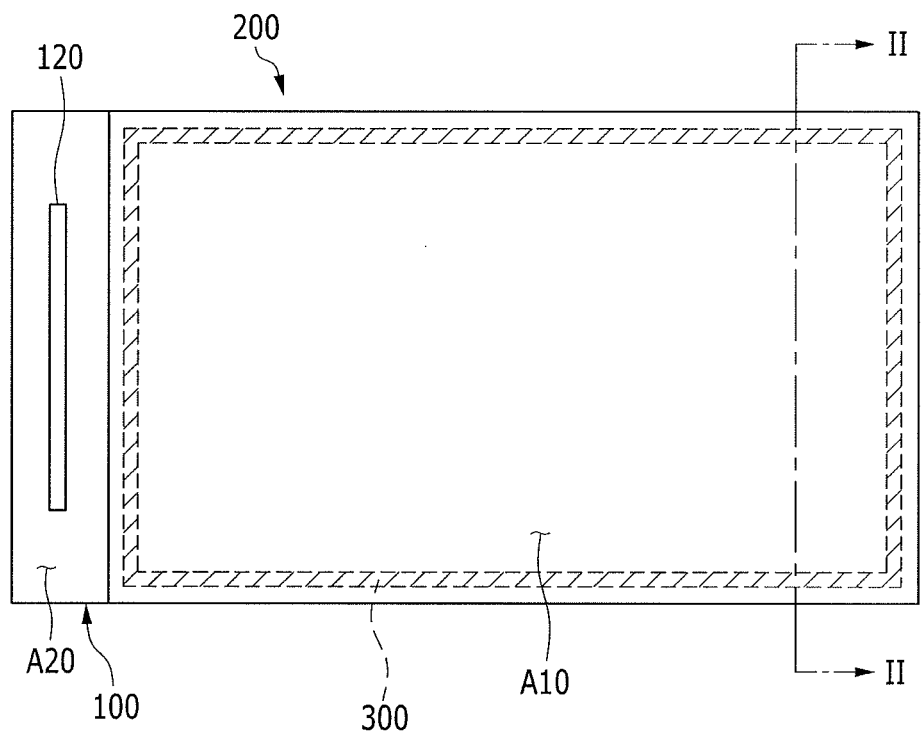
FIG. 1 is a top plan view showing an organic light emitting display panel according to an exemplary embodiment.

Hereinafter, an organic light emitting diode display and a method of manufacturing the same will be described in detail with reference to the drawings. However, the organic light emitting diode display and a method of manufacturing the same are not limited to the following exemplary embodiment and will be embodied in various different forms, and the present exemplary embodiments are provided in order to provide a complete disclosure and completely instruct the scope thereof the invention to the person with skill in the art. The same elements designate the same reference numerals in the drawings.

In the drawings, the thickness of layers, films, panels, regions, etc., is exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising," will be understood to imply the inclusion of stated elements but not the exclusion of any other elements. Further, in the specification, the word "on" refers to positioning on or below the object portion, but does not essentially mean positioning on the upper side of the object portion based on a gravity direction.

Figure 2:
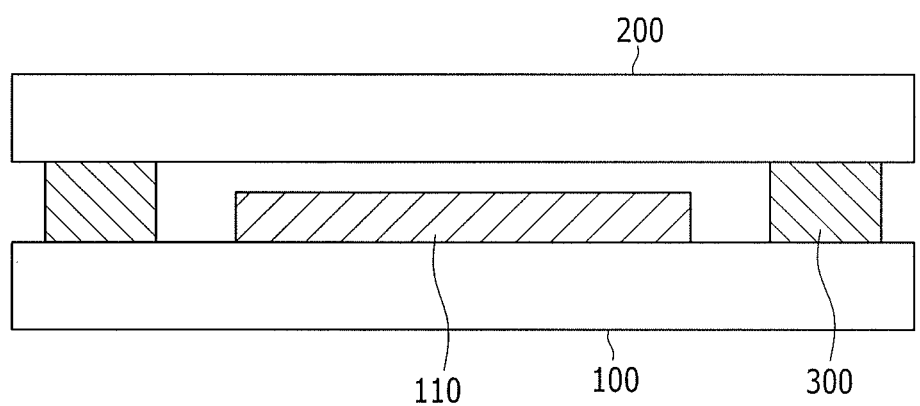
FIG. 2 is a partial cross-sectional view of the organic light emitting display panel, which is taken along line II-II of FIG. 1.

FIG. 1 is a top plan view showing an organic light emitting display panel according to an exemplary embodiment, and FIG. 2 is a partial cross-sectional view of the organic light emitting display panel, which is taken along line II-II of FIG. 1.

First, an organic light emitting display panel will be described. The organic light emitting display panel, as shown in FIG. 1, is constituted to include a display substrate 100, an encapsulation substrate 200, and a first sealing material 300.

The display substrate 100 may be an insulating substrate formed of glass, quartz, ceramics, plastics, and the like, or may be a metal substrate formed of stainless steel and the like. The display substrate 100 may have light transmittance, light reflectance, or light absorption. The display substrate 100 may be divided into a display region A10, in which a wire portion (not shown) and an organic light emitting diode 110 are positioned, and a pad region A20 on which an integrated circuit is mounted.

The wire portion formed in the display region A10 transfers a signal to the organic light emitting diode 110 to drive the organic light emitting diode 110. The organic light emitting diode 110 emits light according to the signal transferred from the wire portion. Although not shown in the drawings, the organic light emitting diode 110 is constituted to include an anode electrode, an organic emission layer, and a cathode electrode. The organic emission layer may further include organic layers efficiently transferring carriers of holes or electrons to the emission layer in addition to the emission layer where light is emitted in practice. The organic layers may be a hole injection layer (HIL) and a hole transport layer (HTL) positioned between the anode and the emission layer, and an electron injection layer (EIL) and an electron transport layer (ETL) positioned between the cathode electrode and the emission layer.

In the organic light emitting diode 110, if a predetermined voltage is applied to the anode electrode and the cathode electrode, holes injected from the anode electrode are moved via the hole transport layer (HTL) forming the emission layer to the emission layer, and electrons injected from the cathode electrode are injected via the electron transport layer (ETL) to the emission layer. In this case, the electrons and the holes are recombined to generate an exciton in the emission layer, and the exciton is changed from an exited state to a bottom state to allow fluorescent molecules of the emission layer to emit light, thus forming an image. The organic light emitting diode 110 receives the signal from the wire portion and displays an image according to the received signal. The term "pixel" refers to a minimum unit displaying an image. The organic light emitting diode display displays the image by using a plurality of pixels.

If the organic light emitting diode 110 were to react with moisture or oxygen, the performance thereof may deteriorate. Accordingly, an encapsulation substrate 200 is disposed on the display region A10 to face the display substrate 100 in order to prevent permeation of moisture or oxygen. The encapsulation substrate 200 may be formed of a metallic material or a transparent material such as glass. Further, a moisture absorbent (not shown) may be formed on the encapsulation substrate 200 so as to absorb moisture. Since the encapsulation substrate 200 covers the display region A10 other than the pad region A20 in the display substrate 100, the encapsulation substrate 200 is formed to be smaller than the display substrate 100, and is positioned in the display substrate 100.

The first sealing material 300 is a member sealing the display region A10, formed between the display substrate 100 and the encapsulation substrate 200. The first sealing material 300 is disposed along the display region A10 of the display substrate 100 and an edge of the encapsulation substrate 200, and attaches the display substrate 100 and the encapsulation substrate 200 to each other to seal the display substrate 100 and the encapsulation substrate 200. The first sealing material 300 may be positioned to be spaced at a predetermined interval from a corner of a surface at which the display substrate 100 and the encapsulation substrate 200 are attached. The first sealing material 300 may be positioned on internal sides, rather than lateral surfaces, of the display substrate 100 and the encapsulation substrate 200. Herein, the term "internal sides" of the display substrate 100 and the encapsulation substrate 200 refers to sides of the display substrate 100 and the encapsulation substrate 200 that face each other. The term "internal corner" refers to a corner formed by an intersection of an internal side and a lateral side. The term "external corner" refers to a corner formed by an intersection of a lateral side and the major exterior surface of the display substrate 100 or the encapsulation substrate 200

The first sealing material 300 may include any one selected from epoxy, acrylate, urethane acrylate, and cyanoacrylate. The first sealing material 300 may be applied in a liquid form on the display substrate 100 to be ultraviolet ray (UV) cured, heat cured, or naturally cured. For example, in the case where the first sealing material 300 includes epoxy, acrylate, and urethane acrylate, the first sealing material may be ultraviolet ray (UV) cured, in the case where the first sealing material includes acrylate, the first sealing material may be heat cured at a temperature that is less than 80° C., and in the case where the first sealing material includes cyanoacrylate, the first sealing material may be naturally cured.

Figure 3:
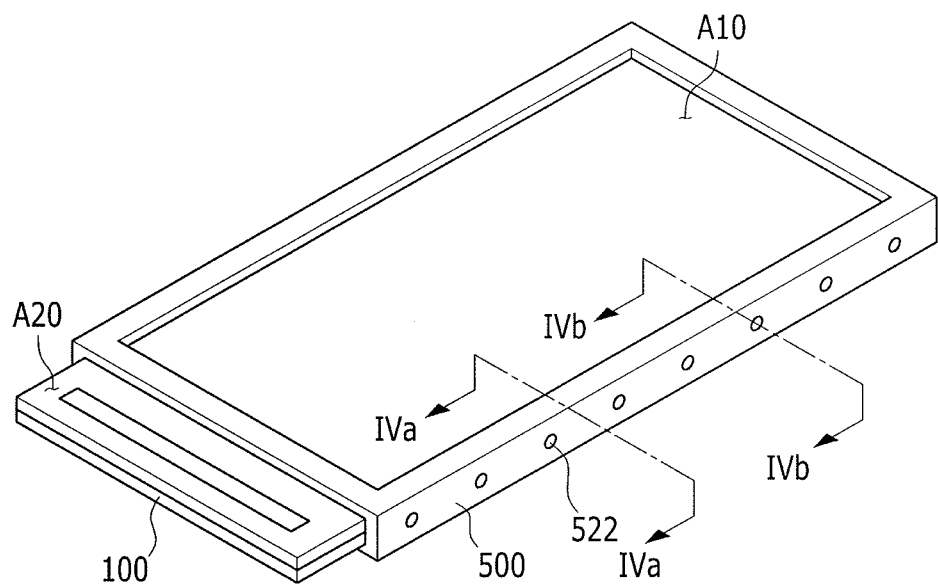
FIG. 3 is a perspective view showing an organic light emitting diode display according to the exemplary embodiment.
Figure 4A:
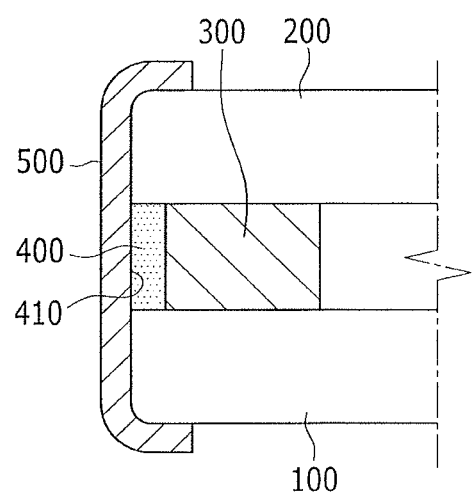
FIG. 4A is a partial cross-sectional view of the organic light emitting diode display, which is taken along lines IVa-IVa of FIG. 3.
Figure 4B:
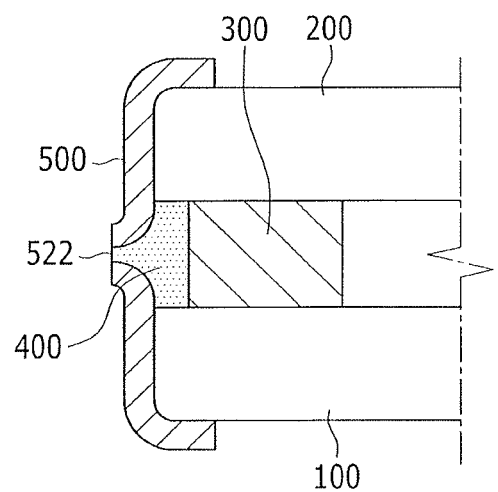
FIG. 4B is a partial cross-sectional view of the organic light emitting diode display, which is taken along lines IVb-IVb of FIG. 3

FIG. 3 is a perspective view showing an organic light emitting diode display according to the exemplary embodiment, and FIGS. 4A and 4B are partial cross-sectional views of the organic light emitting diode display, taken along lines IVa-IVa and IVb-IVb of FIG. 3, respectively.

Referring to the drawings, the organic light emitting diode display according to the exemplary embodiment is constituted to include the display substrate 100, the encapsulation substrate 200, the first sealing material 300, the second sealing material 400, and the molding portion 500.

Since the display substrate 100, the encapsulation substrate 200, and the first sealing material 300 are described in the aforementioned organic light emitting display panel, a description thereof will be omitted.

The second sealing material 400 is a member sealing the first sealing material 300. As shown in FIGS. 4A and 4B, the second sealing material 400 is in contact with an external exposed surface of the first sealing material 300. Like the first sealing material 300, the second sealing material 400 may include any one selected from epoxy, acrylate, urethane acrylate, and cyanoacrylate, but is not limited thereto, and may be selected from various materials that can prevent permeation of moisture. In the case where the first sealing material 300 is positioned on the internal side rather than the lateral surface of the display substrate 100 and the lateral surface of the encapsulation substrate 200, the second sealing material 400 may be formed between the display substrate 100 and the encapsulation substrate 200 to seal the first sealing material 300. In this case, the external exposed surface 410 of the second sealing material 400, as shown in FIG. 4A, may form a continuous flat surface together with the lateral surface of the display substrate 100 and the lateral surface of the encapsulation substrate 200.

Figure 5:
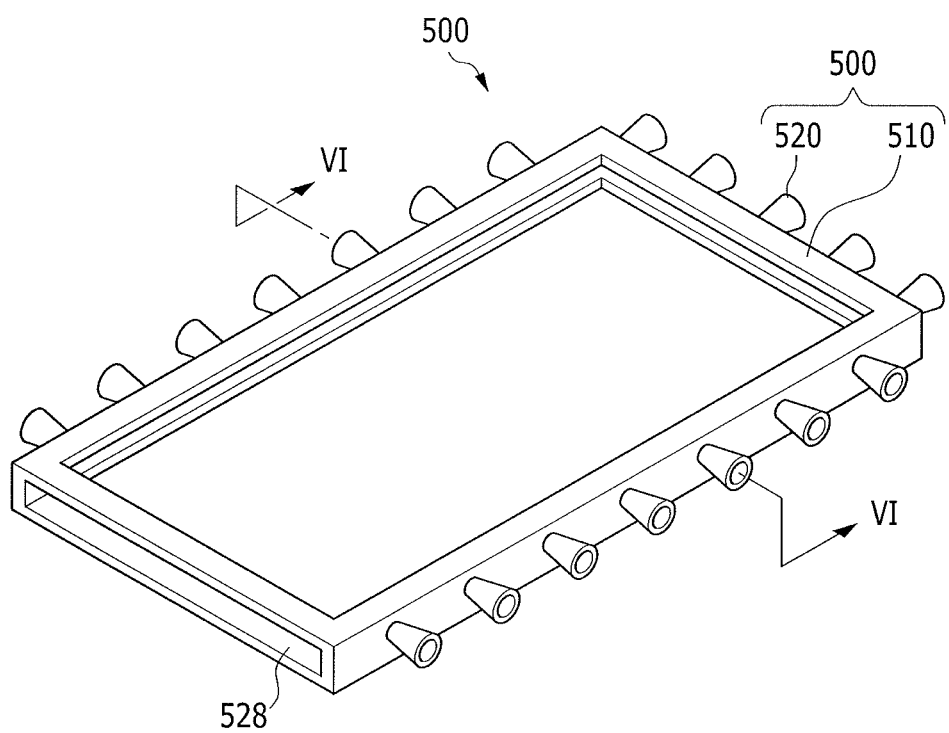
FIG. 5 is a perspective view showing a molding portion according to the exemplary embodiment.
Figure 6:
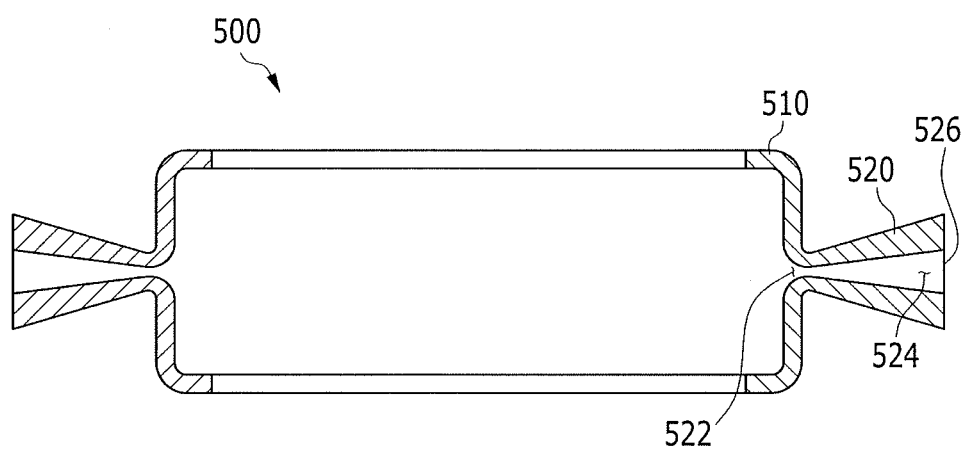
FIG. 6 is a partial cross-sectional view of the molding portion, which is taken along the line VI-VI of FIG. 5.

FIG. 5 is a perspective view showing a molding portion according to the exemplary embodiment, and FIG. 6 is a partial cross-sectional view of the molding portion, which is taken along the line VI-VI of FIG. 5.

The molding portion 500 is a structure protecting the lateral surfaces and the corners of the display substrate 100 and the encapsulation substrate 200 from external impact and sealing the second sealing material 400. is the molding portion 500 may be formed along the external corners of the display substrate 100 and the encapsulation substrate 200 to include a molding portion body 510 surrounding the corners and the lateral surfaces. For example, as shown in FIG. 3, in the case where the display substrate 100 is formed to have a rectangular shape, the display substrate corresponds to the display region A10 other than the corner of the portion corresponding to the pad region A20 and surrounds three sides surrounded by the encapsulation substrate 200.

The molding portion 500 may include any one selected from rubber, urethane, and silicon that is a material having elastic force, but is not limited thereto, and may be selected from various materials having elastic force and restoration force.

The molding portion 500 may further include an opening 522 therethrough in a thickness direction in a region that is in contact with the external exposed surface 410 of the second sealing material 400, that is, a region corresponding to a space between the display substrate 100 and the encapsulation substrate 200 in the molding portion body 510. (See also, FIG. 4B.) The opening 522 allows the liquid second sealing material 400 to be injected. A plurality of openings may be provided to be disposed at predetermined intervals.

The molding portion 500, as shown in FIG. 5, may further include a guide portion 520 connected to the opening 522 and including a path 524 having an injection unit 526 through which the second sealing material 400 is injected at the external side of the molding portion body 510 so that the liquid second sealing material 400 is easily injected. The second sealing material 400 may be injected along the guide portion 520 to the opening 522. It is preferable that the diameter of the path 524 of the guide portion 520 be reduced in a direction toward the opening 522 and the caliber of the injection unit 526 of the guide portion 520 be smaller than the caliber of the opening 522. If the caliber of the injection unit 526 of the guide portion 520 is large, it may be easy to inject the second sealing material 400, and if the caliber of the opening 522 is small, the molding portion 500 may firmly seal the second sealing material 400. The guide portion 520 may be integrally formed with the molding portion body 510. After the second sealing material 400 is injected, the guide portion 520 may be cut out from the molding portion body 510 by using a cutter 700.

Hereinafter, a method of manufacturing the organic light emitting diode display according to the exemplary embodiment will be described with reference to the drawings.

Figure 7A:
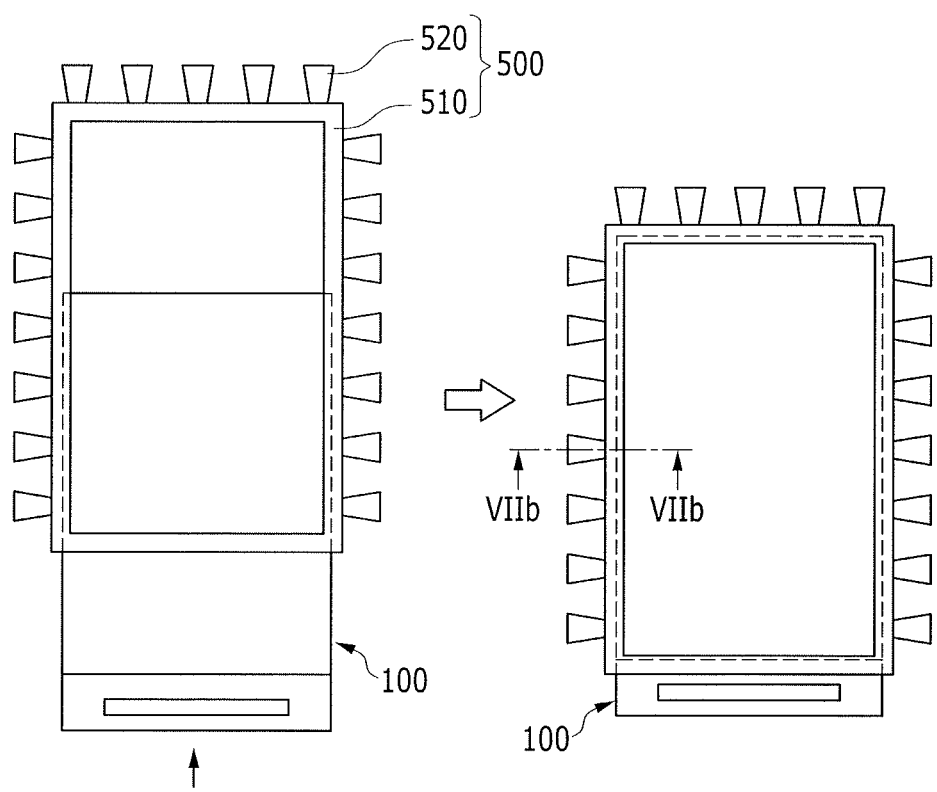
FIGS. 7A, 8A, and 9A are top plan views showing stages of a method of manufacturing the organic light emitting diode display according to the exemplary embodiment.
Figure 7B:
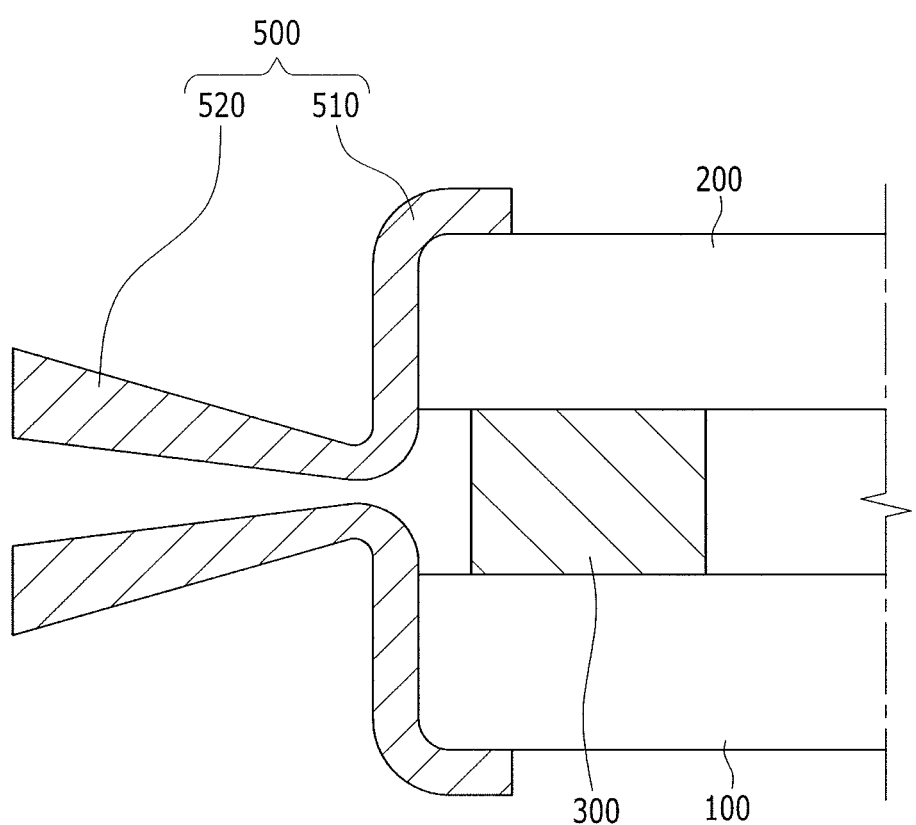
FIGS. 7B, 8B, and 9B are cross-sectional views showing the stages of the method of manufacturing the organic light emitting diode display according to the exemplary embodiment.
Figure 8A:
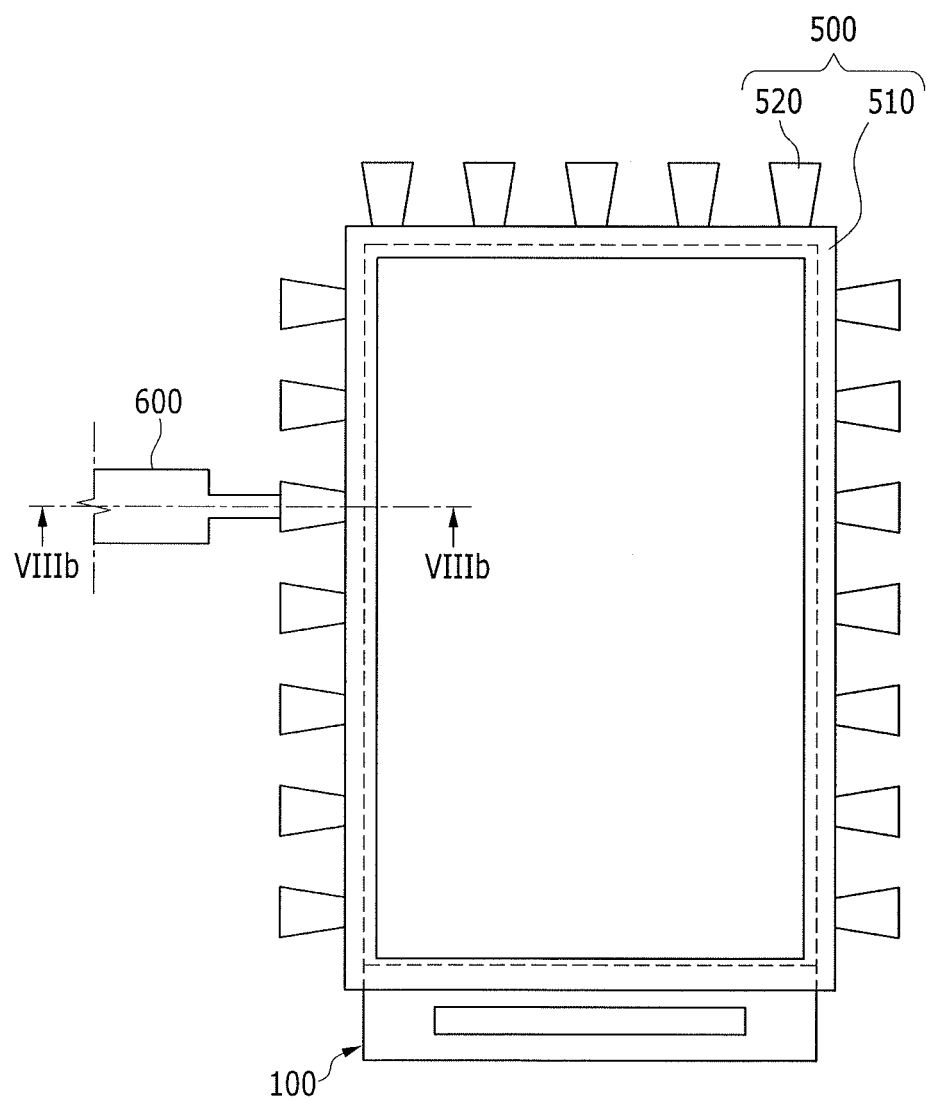
Figure 8B:
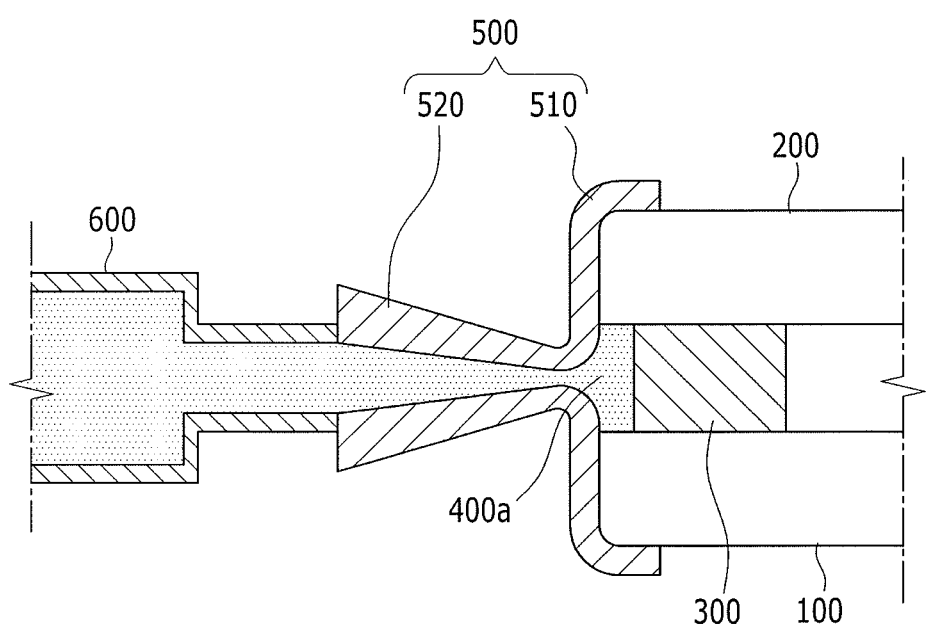
Figure 9A:
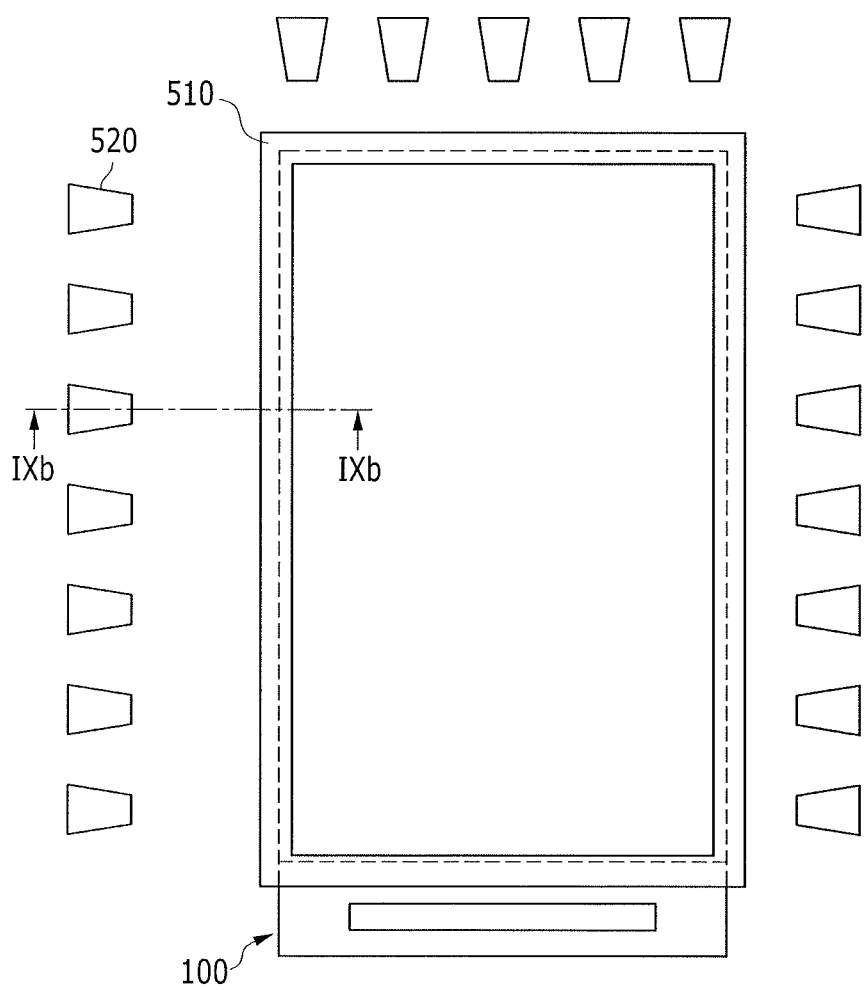
Figure 9B:
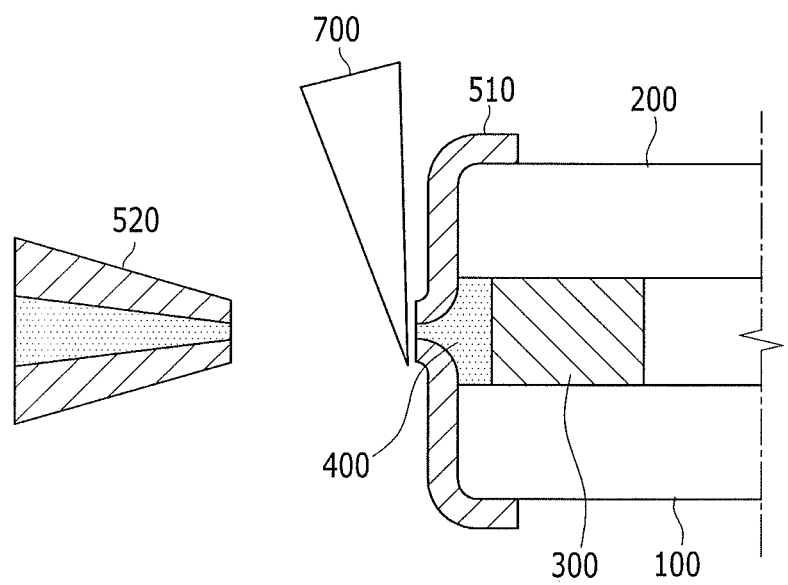

FIGS. 7A, 8A, and 9A are top plan views showing stages of a method of manufacturing the organic light emitting diode display according to the exemplary embodiment, and FIGS. 7B, 8B, and 9B are cross-sectional views showing the stages of the method of manufacturing the organic light emitting diode display according to the exemplary embodiment.

The method of manufacturing the organic light emitting diode display according to the exemplary embodiment includes preparing the display substrate 100, preparing the encapsulation substrate 200, forming the first sealing material 300, forming the molding portion 500, and forming the second sealing material 400.

As described above, the display substrate 100 divided into a display region A10 in which a wire portion (not shown) and an organic light emitting diode 110 are positioned and a pad region A20 on which an integrated circuit is mounted is prepared. The encapsulation substrate 200 covering the display region A10 is prepared.

Then, the display substrate 100 and the encapsulation substrate 200 are attached to each other and sealed by forming the first sealing material 300 along the display region A10 of the display substrate 100 and the edge of the encapsulation substrate 200. The first sealing material 300 may be applied in a liquid form on the display substrate 100 or the encapsulation substrate 200, and then cured by a method such as ultraviolet ray (UV) curing, heat curing, or natural curing. The first sealing material 300 is spaced at a predetermined interval from the corner of the surface at which the display substrate 100 and the encapsulation substrate 200 are attached, thus being positioned on the internal side rather than the lateral surface of the display substrate 100 and the lateral surface of the encapsulation substrate 200.

The molding portion 500 is formed to surround the lateral surface and the external corner of each of the attached display substrate 100 and encapsulation substrate 200. In this case, the attached display substrate 100 and encapsulation substrate 200, as shown in FIG. 7A, may be inserted through the insert unit 528 formed in one side of the molding portion body 510 to form the molding portion 500. An opening 522 and a guide portion 520 for injecting the liquid second sealing material 400 may be further formed in the molding portion body 500. The opening 522 is formed at a position corresponding to a position of the first sealing material 300 disposed between the display substrate 100 and the encapsulation substrate 200.

After the molding portion 500 is formed, the first sealing material 300 is sealed by forming the second sealing material 400 between the first sealing material 300 and the molding portion 500. The second sealing material 400a provided in a liquid form having appropriate viscosity is injected through the opening 522 or the guide portion 520 connected to the opening 522 into a space between the first sealing material 300 and the molding portion 500 to be filled therein. As shown in FIGS. 8A and 8B, the liquid second sealing material 400a may be injected by connecting a second sealing material injection device 600 to the opening 522 or the injection unit of the guide portion 520. An injection device such as a syringe may be used as the second sealing material injection device 600. As described above, it is possible to prevent spattering or flowing down of the liquid sealing material when the second sealing material is formed by injecting the liquid second sealing material through the opening 522 or the guide portion 520.

In the case where a plurality of openings 522 or guide portions 520 is formed, it is possible to prevent occurrence of a region where the second sealing material is not formed by sequentially injecting the liquid second sealing material 400a for each opening 522 or guide portion 520.

After the second sealing material 200 is injected along the path of the guide portion 520, the guide portion 520 may be cut by using a cutter 700 to be removed. The second sealing material 400 is injected and then cured to attach the substrates 100 and 200 and the molding portion 500.

Hereinafter, an organic light emitting diode display according to another exemplary embodiment will be described.

Figure 10A:
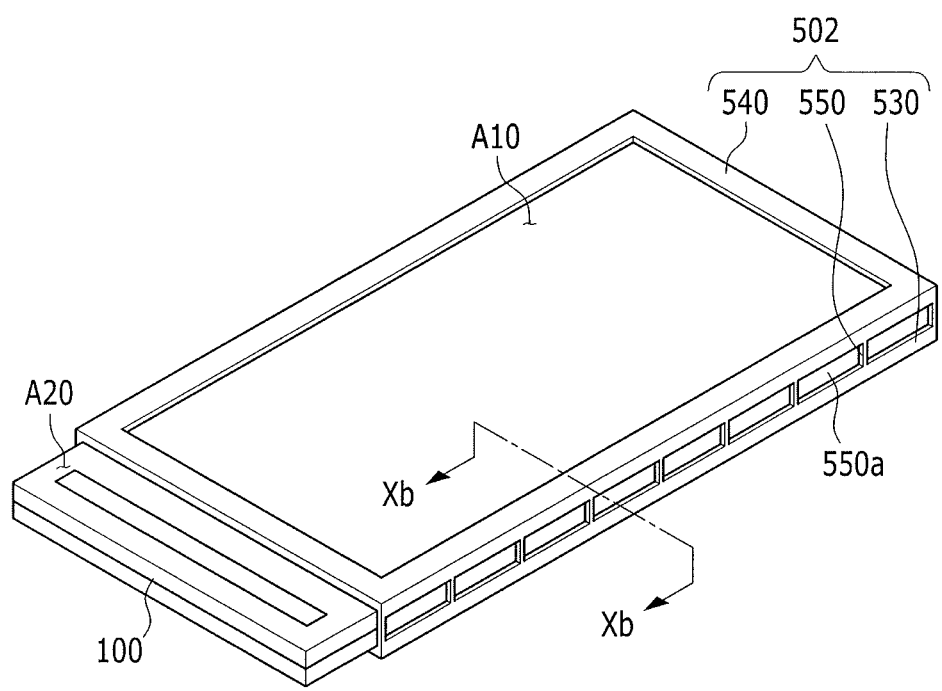
FIG. 10A is a perspective view showing an organic light emitting diode display according to another exemplary embodiment.
Figure 10B:
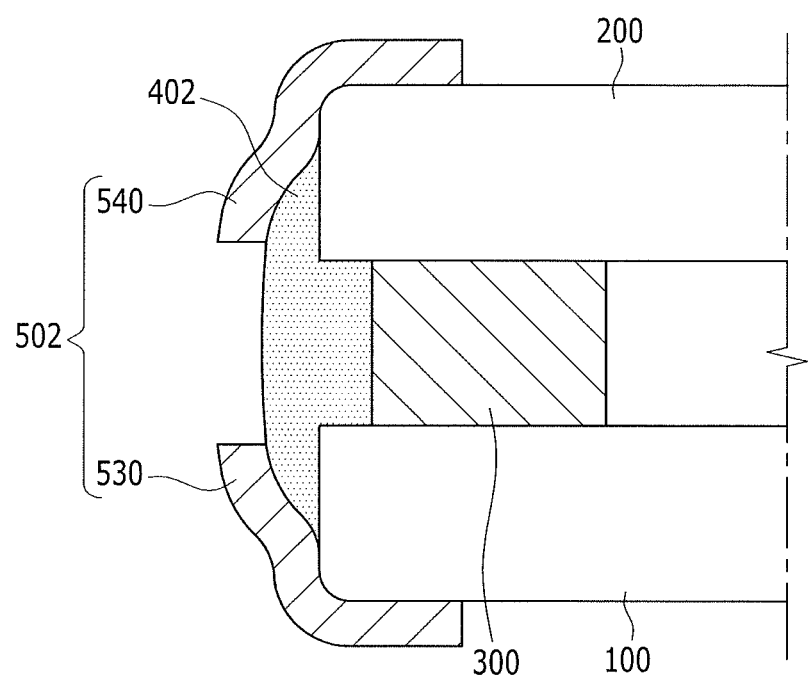
FIG. 10B is a partial cross-sectional view of the organic light emitting display panel, which is taken along line Xb-Xb of FIG. 10A.

FIG. 10A is a perspective view showing an organic light emitting diode display according to another exemplary embodiment, and FIG. 10B is a partial cross-sectional view of the organic light emitting display panel, which is taken along line Xb-Xb of FIG. 10A.

Since the organic light emitting diode display according to another exemplary embodiment has the same constitution as the aforementioned exemplary embodiment with the exception of modification of the second sealing material 402 and the molding portion 502, only the modified constitution will be described. The same reference numeral is used in respects to the same member as the aforementioned exemplary embodiment.

The second sealing material 402 may cover the external exposed surface of the first sealing material 300, a space between the display substrate 100 and the encapsulation substrate 200, internal corners of the display substrate 100 and the encapsulation substrate 200, which face each other, the lateral surface of the display substrate 100, and the lateral surface of the encapsulation substrate 200.

The molding portion 502 may be constituted to include a display substrate molding portion 530 surrounding the external corner of the display substrate 100, an encapsulation substrate molding portion 540 surrounding the external corner of the encapsulation substrate 200, and a connection portion 550 connecting the display substrate molding portion 530 and the encapsulation substrate molding portion 540. The display substrate molding portion 530, as shown in FIG. 10B, surrounds a portion of the second sealing material 402 covering the internal corner of the display substrate 100, and the encapsulation substrate molding portion 540 surrounds a portion of the second sealing material 402 covering the internal corner of the encapsulation substrate 530. That is, the molding portion 502 may protect an end of the second sealing material 402 to prevent peeling of the second sealing material 402.

The connection portion 550 connects the display substrate molding portion 530 and the encapsulation substrate molding portion 540 spaced apart from each other. A plurality of connection portions may be provided to be spaced and disposed at predetermined intervals. A space 550a is formed for a space between a plurality of connection portions 550 spaced from each other. The liquid second sealing material 400 may be injected through the space.

Hereinafter, a method of manufacturing the organic light emitting diode display according to another exemplary embodiment will be described.

Figure 11A:
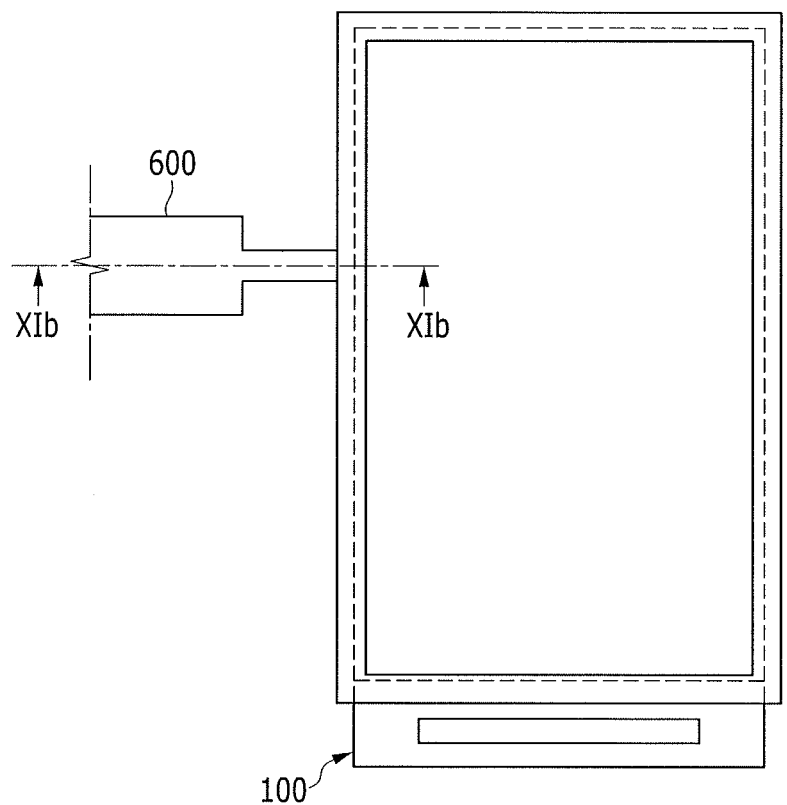
FIG. 11A is a top plan view showing a stage of the method of manufacturing the organic light emitting diode display according to another exemplary embodiment.
Figure 11B:
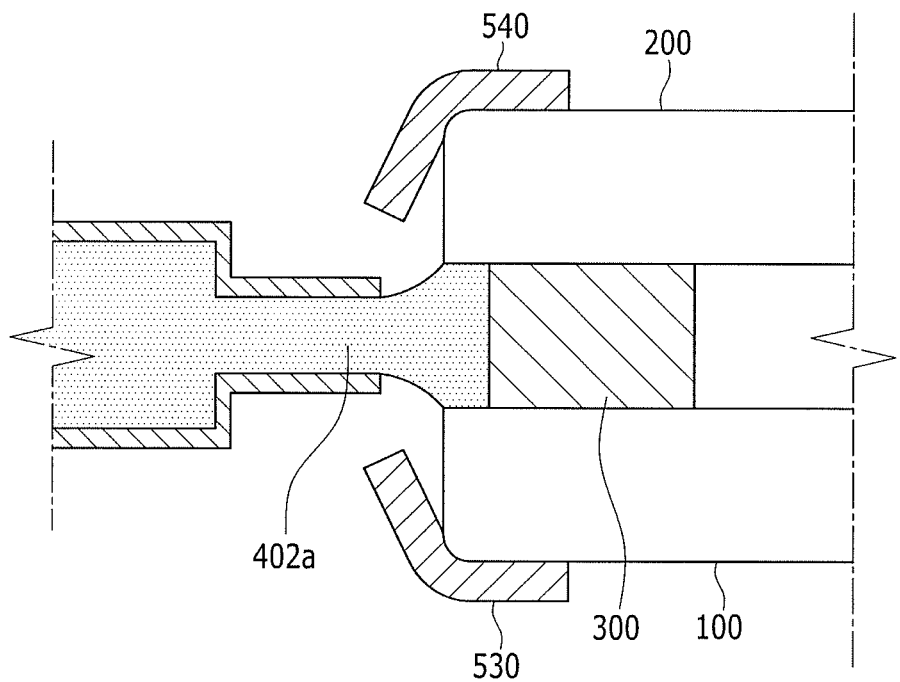
FIG. 11B is a cross-sectional view taken along line XIb-XIb of FIG. 11A.

FIG. 11A is a top plan view showing a stage of the method of manufacturing the organic light emitting diode display according to another exemplary embodiment, and FIG. 11B is a cross-sectional view taken along line XIb-XIb of FIG. 11A.

Since the method of manufacturing the organic light emitting diode display according to another exemplary embodiment is similar to the manufacturing method of the aforementioned exemplary embodiment with the exception of modification of forming the molding portion 502 and forming the second sealing material 402, only the modifications will be described. The same reference numerals are used with respect to the same members as in the manufacturing method of the aforementioned exemplary embodiment.

The molding portion 502 is formed to surround the lateral surface and the external corner of each of the display substrate 100 and the encapsulation substrate 200 attached to each other. The display substrate molding portion 530 surrounds a portion of the second sealing material 402 covering the internal corner of the display substrate 100, and the molding portion 502 is disposed so that the encapsulation substrate molding portion 540 surrounds a portion of the second sealing material 402 covering the internal corner of the encapsulation substrate 530.

After the molding portion 500 is formed, the first sealing material 300 is sealed by forming the second sealing material 402 between the first sealing material 300 and the molding portion 500. The second sealing material 400a, provided in a liquid form having appropriate viscosity, is injected through all the spaces 550a formed between a plurality of connection portions 550 to fill the space between the first sealing material 300 and the molding portion 500.

By way of summation and review, if an organic light emitting diode including an organic material is contaminated with moisture or oxygen, the performance thereof may be deteriorated. Therefore, in the organic light emitting display panel, an encapsulation technology is used in order to reduce the possibility or and/or prevent permeation of moisture and oxygen.

The encapsulation technology including an encapsulation substrate is used to attach the display substrate, on which the organic light emitting diode is formed, to the encapsulation substrate with a sealing material. However, this method may not sufficiently prevent permeation of moisture or oxygen due to a characteristic of the sealing material. Accordingly, an organic light emitting diode produced by the encapsulation technology may have a limited life-span.

In contrast, according to exemplary embodiments, permeation of external moisture and oxygen may be efficiently suppressed to reduce the possibility or and/or prevent occurrence of cracks in the sealing material, thus reducing the possibility or and/or preventing breaking of the organic light emitting diode display and improving an encapsulation lifespan with regard to the organic light emitting diode. The structure of the organic light emitting diode display may prevent moisture and oxygen from being transmitted therein.

Further, in a method of manufacturing an organic light emitting diode display, spattering or flowing down of the sealing material may be reduced or prevented when the liquid sealing material is injected. Accordingly, it may be possible to prevent a waste of the sealing material, thus increasing production efficiency.

While this disclosure has been described in connection with what is presently considered to be practical exemplary embodiments, it is to be understood to not be limited to the disclosed embodiments, but, on the contrary, it is intended to cover various modifications and equivalent arrangements included within the spirit and scope of the appended claims.

What is claimed is:

1. An organic light emitting diode display, comprising:
 a display substrate including a display region having an organic light emitting diode;
 an encapsulation substrate facing the display substrate and covering the display region;
 a first sealing material between the display substrate and the encapsulation substrate, the first sealing material sealing the display region;
 a second sealing material in contact with an external exposed surface of the first sealing material and sealing the first sealing material; and
 a molding portion surrounding a lateral surface and an external corner of each of the display substrate and the encapsulation substrate and surrounding an external exposed surface of the second sealing material, the molding portion including an opening passing therethrough in a thickness direction in a region in contact with the external exposed surface of the second sealing material.

2. The organic light emitting diode display of claim 1, wherein:
 the molding portion is formed of a material having elastic force.

3. The organic light emitting diode display of claim 2, wherein:
 the material having the elastic force includes any one selected from rubber, urethane, and silicon.

4. The organic light emitting diode display of claim 1, wherein:
 the opening includes a plurality of openings disposed at predetermined intervals.

5. The organic light emitting diode display of claim 1, wherein:
 the first sealing material is positioned on internal sides of the display substrate and the encapsulation substrate, spaced apart from lateral surfaces of the display substrate and the encapsulation substrate, and
 the second sealing material is formed between the display substrate and the encapsulation substrate.

6. The organic light emitting diode display of claim 5, wherein:
 the external exposed surface of the second sealing material forms a continuous flat surface together with the lateral surface of the display substrate and the lateral surface of the encapsulation substrate.

7. An organic light emitting diode display, comprising:
 a display substrate including a display region having an organic light emitting diode;
 an encapsulation substrate facing the display substrate and covering the display region;
 a first sealing material between the display substrate and the encapsulation substrate, the first sealing material sealing the display region;
 a second sealing material in contact with an external exposed surface of the first sealing material and sealing the first sealing material; and
 a molding portion surrounding a lateral surface and an external corner of each of the display substrate and the encapsulation substrate and surrounding an external exposed surface of the second sealing material:
 the second sealing material covers internal corners facing each other in the display substrate and the encapsulation substrate, the lateral surface of the display substrate, and the lateral surface of the encapsulation substrate, and
 the molding portion includes:
  a display substrate molding portion formed along an external corner of the display substrate to surround a portion of the external exposed surface of the second sealing material,
  an encapsulation substrate molding portion spaced from the display substrate molding portion and formed along an external corner of the encapsulation substrate to surround the portion of the external exposed surface of the second sealing material, and
  a connection portion connecting the display substrate molding portion and the encapsulation substrate molding portion, the connection portion including a plurality of connection portions at predetermined intervals.

8. A method of manufacturing an organic light emitting diode display, the method comprising:
 preparing a display substrate including a display region having an organic light emitting diode;
 preparing an encapsulation substrate to face the display substrate and cover the display region;

sealing the display region by forming a first sealing material between the encapsulation substrate and the display substrate;

forming a molding portion so as to surround a lateral surface and an external corner of each of the display substrate and the encapsulation substrate, the molding portion being formed to include an opening therethrough in a thickness direction at a position corresponding to a position of the first sealing material; and sealing the first sealing material by forming a second sealing material between the first sealing material and the molding portion, such that the second sealing material is in contact with an external exposed surface of the first sealing material, and the opening in the molding portion is in contact with the external exposed surface of the second sealing material.

9. The method of manufacturing an organic light emitting diode display of claim 8, wherein:

the sealing of the first sealing material includes injecting the second sealing material in a liquid phase through the opening.

10. The method of manufacturing an organic light emitting diode display of claim 9, wherein:

the opening includes a plurality of openings at predetermined intervals.

11. The method of manufacturing an organic light emitting diode display of claim 10, wherein:

the molding portion further includes a guide portion connected to the opening, the guide portion including a path having an injection unit at an external side thereof through which the second sealing material is injected, and the second sealing material is injected through the guide portion into the opening.

12. The method of manufacturing an organic light emitting diode display of claim 11, wherein:

the injection unit of the guide portion has a caliber that is smaller than a caliber of the opening.

13. The method of manufacturing an organic light emitting diode display of claim 11, further comprising, after the second sealing material is injected along the path of the guide portion, removing the guide portion by cutting the guide portion.

14. The method of manufacturing an organic light emitting diode display of claim 8, wherein:

the molding portion is formed of a material having elastic force.

15. The method of manufacturing an organic light emitting diode display of claim 14, wherein:

the material having the elastic force includes any one selected from rubber, urethane, and silicon.

16. The method of manufacturing an organic light emitting diode display of claim 8, wherein:

the molding portion includes:

a display substrate molding portion formed along an external corner of the display substrate to surround a portion of the external exposed surface of the second sealing material, an encapsulation substrate molding portion spaced from the display substrate molding portion and formed along an external corner of the encapsulation substrate to surround the portion of the external exposed surface of the second sealing material, and a plurality of connection portions connecting the display substrate molding portion and the encapsulation substrate molding portion and disposed to be at predetermined intervals, wherein the opening in the molding portion is defined by a space between adjacent connection portions and the sealing of the first sealing material includes providing the second sealing material in a liquid phase to inject the second sealing material through the opening.

* * * * *